United States Patent [19]
Suzuki

[11] Patent Number: 5,539,698
[45] Date of Patent: Jul. 23, 1996

[54] REDUNDANCY CIRCUIT DEVICE

[75] Inventor: Azuma Suzuki, Toyko-to, Japan

[73] Assignee: Kabushiki Kaisha Toshiba, Kawasaki, Japan

[21] Appl. No.: 378,268

[22] Filed: Jan. 26, 1995

[30] Foreign Application Priority Data

Jan. 26, 1994 [JP] Japan .................................. 6-007185

[51] Int. Cl.$^6$ ..................................... G11C 7/00
[52] U.S. Cl. ..................... 365/200; 365/230.03
[58] Field of Search ............................ 365/200, 96, 195, 365/230.03

[56] References Cited

U.S. PATENT DOCUMENTS

5,373,471 12/1994 Saeki .......................... 365/200

*Primary Examiner*—A. Zarabian
*Attorney, Agent, or Firm*—Foley & Lardner

[57] ABSTRACT

The redundancy circuit device includes a main word line 1 for selecting a first memory area and a subsidiary word line 2, and a spare subsidiary word line 4 for selecting a second memory area (in which spare memory cells are arranged). In case a defective memory cell exists in the first memory cell area, the address is programmed by a redundancy program circuit 14 of a redundancy circuit 41 (provided for each section) of a section decoder 42. Further, when a row partial signal outputted from a row partial decoder 13 hits a defective memory cell, the spare subsidiary word line 4 is selected through the redundancy program circuit 14 to select the spare memory cell, without selecting the subsidiary word line 2. In a memory device of double word line system, a defective memory cell can be replaced with a spare memory cell in unit of each of a plurality of the subsidiary word lines connected to the main word line, thus improving the redundancy efficiency and thereby increasing the production yield of the memory chip.

17 Claims, 11 Drawing Sheets

REDUNDANCY CIRCUIT DEVICE

FIELD OF THE INVENTION

The present invention relates to a redundancy circuit device, and more specifically to a redundancy circuit device particularly suitable for a semiconductor memory device, which can improve the product remedy rate effectively by replacing defective cells with spare cells.

BACKGROUND OF THE INVENTION

Figure 5A:
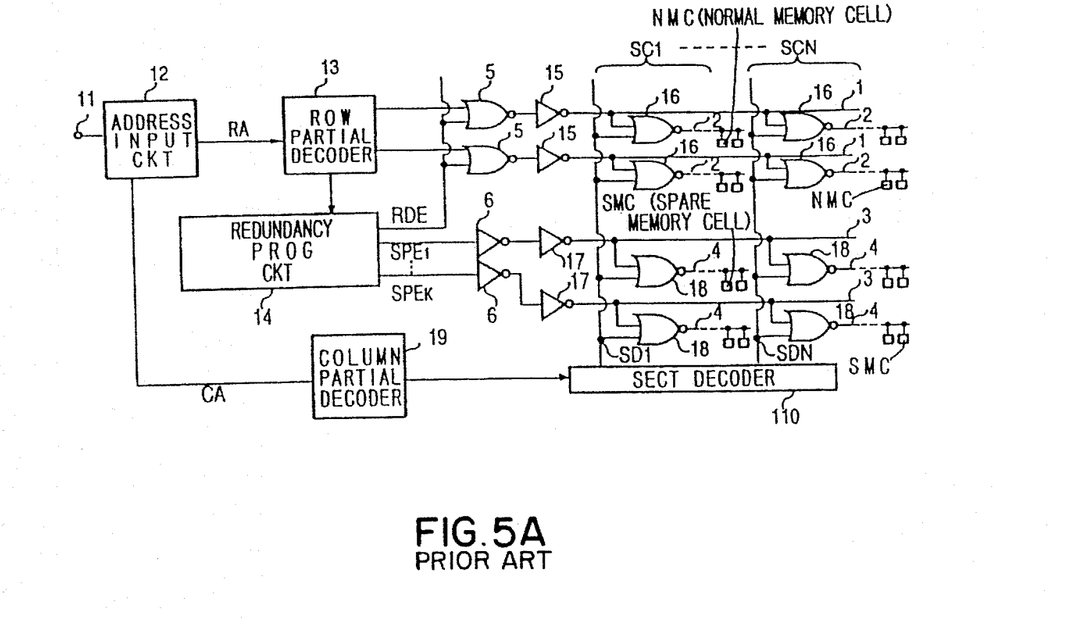
FIGS. 5(A) and 5(B) are circuit diagrams showing a first example of the prior art redundancy circuit device.
Figure 5B:
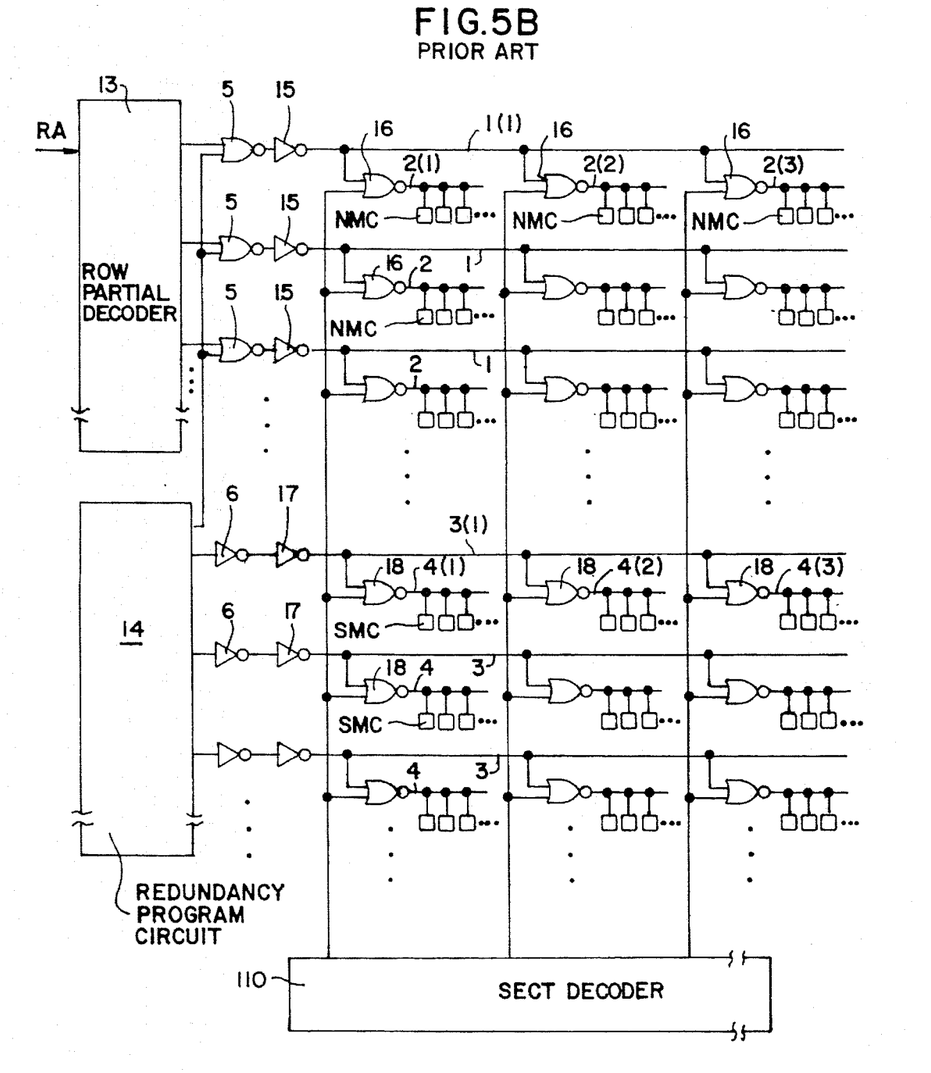

FIGS. 5(A) and 5(B) show an example of prior art redundancy circuit devices related to the present invention, in which an inhibit system construction is shown in particular. In these figures, the memory cells (not shown) are arranged into a matrix pattern at intersection positions between a plurality of bit line pairs and a plurality of word line pairs. Further, the cells arranged in the word line direction are selected by a main word line 1 and subsidiary word lines 2 divided into N-units of sections SC1 to SCN in the word line direction, which is referred to as a double word line memory system.

Further, in case there exist a defective memory cell, the defective cell can be replaced with a non-defective spare cell; that is, the redundancy can be achieved. In this case, the spare cell is selected by using a spare main word line 3 and a spare subsidiary word line 4 for redundancy.

Further, an address signal for accessing the memory cell is applied to an address input circuit 12 through an address input terminal 11. On the basis of the address signal, the address input circuit 12 generates a row address RA and a column address CA. The generated row address RA is given to a row partial decoder 13 and the generated column address CA is given to a column partial decoder 19, respectively.

The row partial decoder 13 is connected to a redundancy program circuit 14. Therefore, when a spare cell is required to be selected for redundancy, the redundancy program circuit 14 generates one of spare select signals SPE1 to SPEK to select any one of K-units of spare cells and further a redundancy enable signal RDE indicative of the spare cell selection for redundancy.

The row partial decoder 13 decodes the row address RA and then gives the decoded row address RA to a main word line driver 15 via a NOR circuit 5. Here, since the redundancy enable signal RDE is inputted from the redundancy program circuit 14 to the NOR circuit 5, when the redundancy is not achieved, the NOR circuit 5 outputs a signal for selecting the main word line 1 to the main word line driver 15 on the basis of the signal given by the row partial decoder 13. As a result, the main word line driver 15 drives the main word line 1 on the basis of the signal given by the row partial decoder 13.

On the other hand, when the redundancy is achieved, the redundancy program circuit 15 outputs the redundancy enable signal RDE for restricting the output of the NOR circuit 5 and the spare select signals SPE1 to SPEK for selecting any one of the K-units of spare cells. The spare select signals SPE1 to SPEK are given to spare main word line drivers 17 via NOT circuits 6, respectively to drive any one of the K-units of the spare main word lines 3.

On the other hand, the column partial decoder 19 decodes the column address CA and then gives the decoded column address CA to a section decoder 110. The section decoder 110 generates section select signals SD1 to SDN to select any one of the N-units of the sections and supplies the generated section select signals to subsidiary word line drivers 16 and spare subsidiary word line drivers 18, respectively. As a result, when the redundancy is not generated, any of the subsidiary word lines 2 is selected; and when the redundancy is generated, any of the spare subsidiary word lines 4 is selected.

In the construction as described above, when the memory cells (not shown) are normal, the main word line 1 and the subsidiary word line 2 are selected on the basis of an address signal inputted through the address input terminal 11.

On the other hand, in case any of the memory cells is defective, and therefore when the redundancy is generated with respect to the row address selected by the row partial decoder 13, a spare cell is selected by the redundancy program circuit 14. Further, on the basis of the selected result, the spare main word line 3 and the spare subsidiary word line 4 are both selected.

Figure 6:
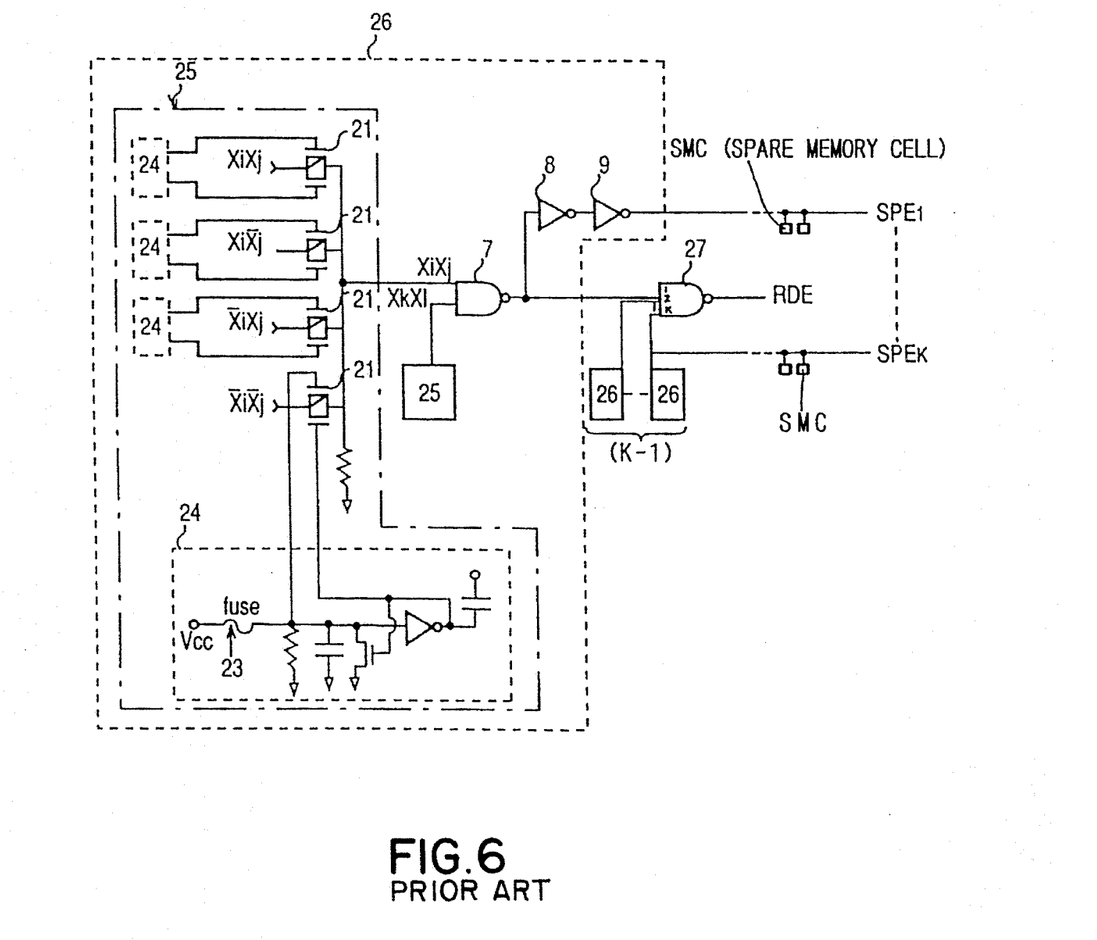
FIG. 6 is a circuit diagram showing a redundancy program circuit shown in FIGS. 1 and 5.

FIG. 6 shows a more detailed construction of the redundancy program circuit 14 shown in FIGS. 5(A) and 5(B).

The spare select signals SPE1 to SPEK are outputted on the basis of the respective programmed results of N-units of program sections 26.

A program section 26 includes a plurality of defective address program circuits 25 in correspondence to the row partial signals applied by the row partial decoder 13.

In the defective address program circuit 25, 4 fuse circuits 24 are provided in correspondence to the row partial signals XiXj, Xi/Xj, /XiXj and /Xi/Xj, respectively.

In the fuse circuit 24, a fuse 23 formed of poly silicon is provided so as to be cut off by a laser, for instance when a defective cell exits and thereby a program for replacing the defective cell with the spare cell must be prepared. When the fuse 23 is cut off, any of transfer gates 21 arranged in the defective address program circuit 25 can be selectively turned on.

In the defective address program circuit 25, since any one of the 4 transfer gates 21 can be turned on by cutting-off the fuse in the fuse circuit 24, any of the row partial signals XiXj, Xi/Xj, /XiXj and /Xi/Xj is selected by the transfer gates 21 and then outputted from the defective address program circuit 25.

In the other program sections 26, the defective address program circuits 25 are provided respectively so as to correspond to the other row partial signals XkX1, respectively. Further, the outputs of the defective address program circuits 25 are given to a NAND circuit 7 to obtain a logical result, and then outputted as the spare select signal SPE1 to SPEK via a NOT circuit 8 and a NOT circuit 9, respectively.

Further, when the spare select signal SPE1 to SPEK is outputted from any one of the K-units of the program sections 26, the outputted spare select signal is detected by a NAND circuit 27 and outputted as the redundancy enable signal RDE.

In other words, where the replacement with the spare cells has been programmed by cutting off the fuses 23 of the fuse circuits 24 and further the row address selected by the row partial decoder 13 is defective, the defective address of the memory cell can be detected by the defective address program circuits 25. As a result, the spare select signals SPE1 to SPEK are outputted by the program sections 26 provided for each spare cell, and at the same time the redundancy enable signal RDE is outputted.

As a result of the operation as described above, the output of the NOR circuit 5 is inhibited; that is, the access to the main word line 1 and the subsidiary word line 2 are inhibited. Instead, the spare main word line 3 is selected by the spare select signals SPE1 to SPEK, and the spare subsidiary word line 4 belonging to the selected spare main word line 3 is selected in one of the sections SC1 to SCN selected by the section decoder 110.

That is, in case there exists a defective cell, the defective cell is previously programmed in the redundancy program circuit 14. Further, when a defective cell is selected by the row partial decoder 13, both the main word line 1 and the subsidiary word line 2 are switched to the spare main word line 3 and the spare subsidiary word line 4 together on the basis of the previously prepared program of the redundancy program circuit 14, so that the spare cell can be selected.

In the redundancy system as described above, when the programmed defective address is found, since the redundancy enable signal RDE is outputted not to select the defective address but to select the spare address, this system is referred to as inhibit system.

Figure 7A:
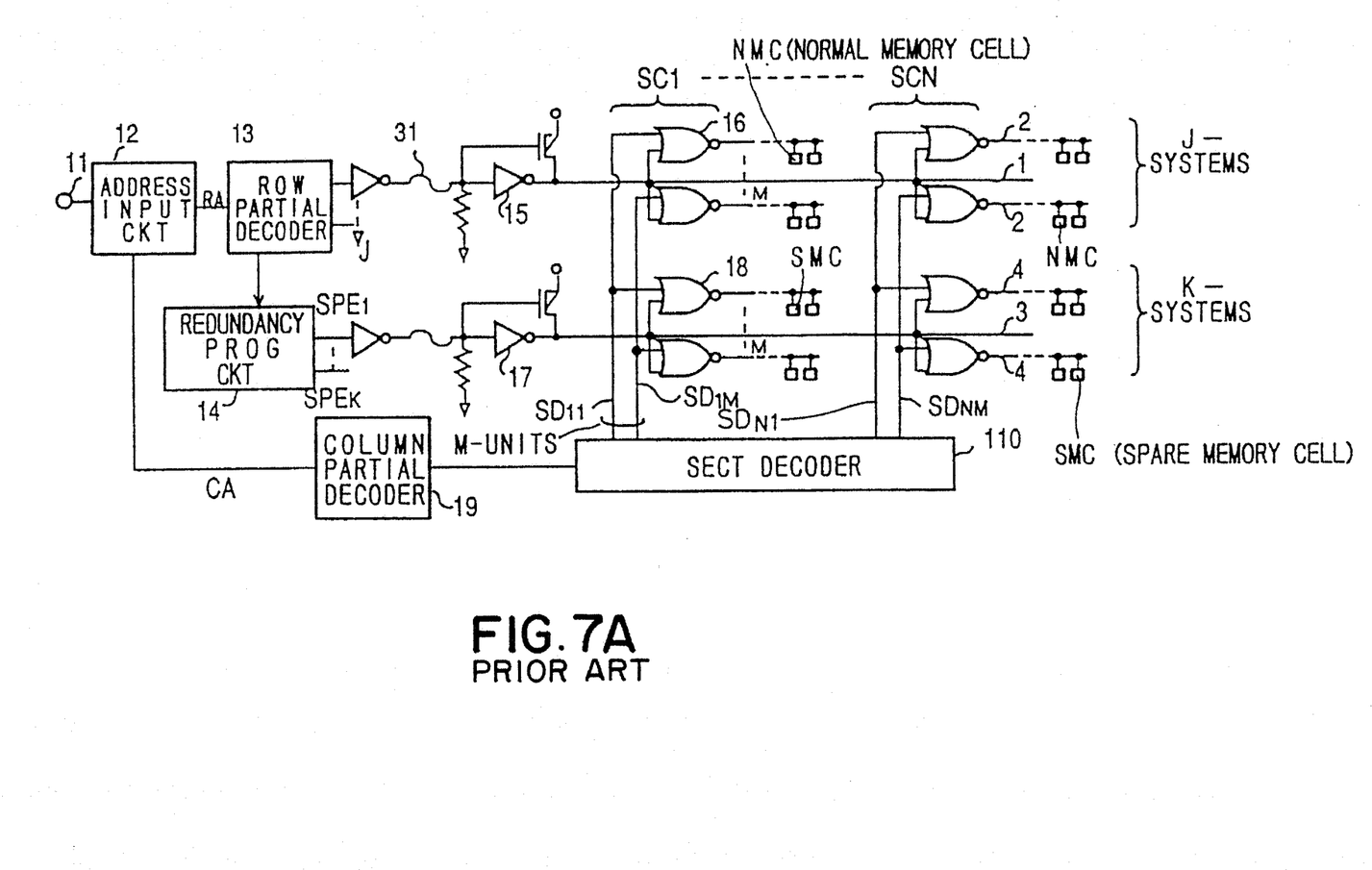
FIGS. 7(A) and 7(B) are circuit diagrams showing a second example of the prior art redundancy circuit device.
Figure 7B:
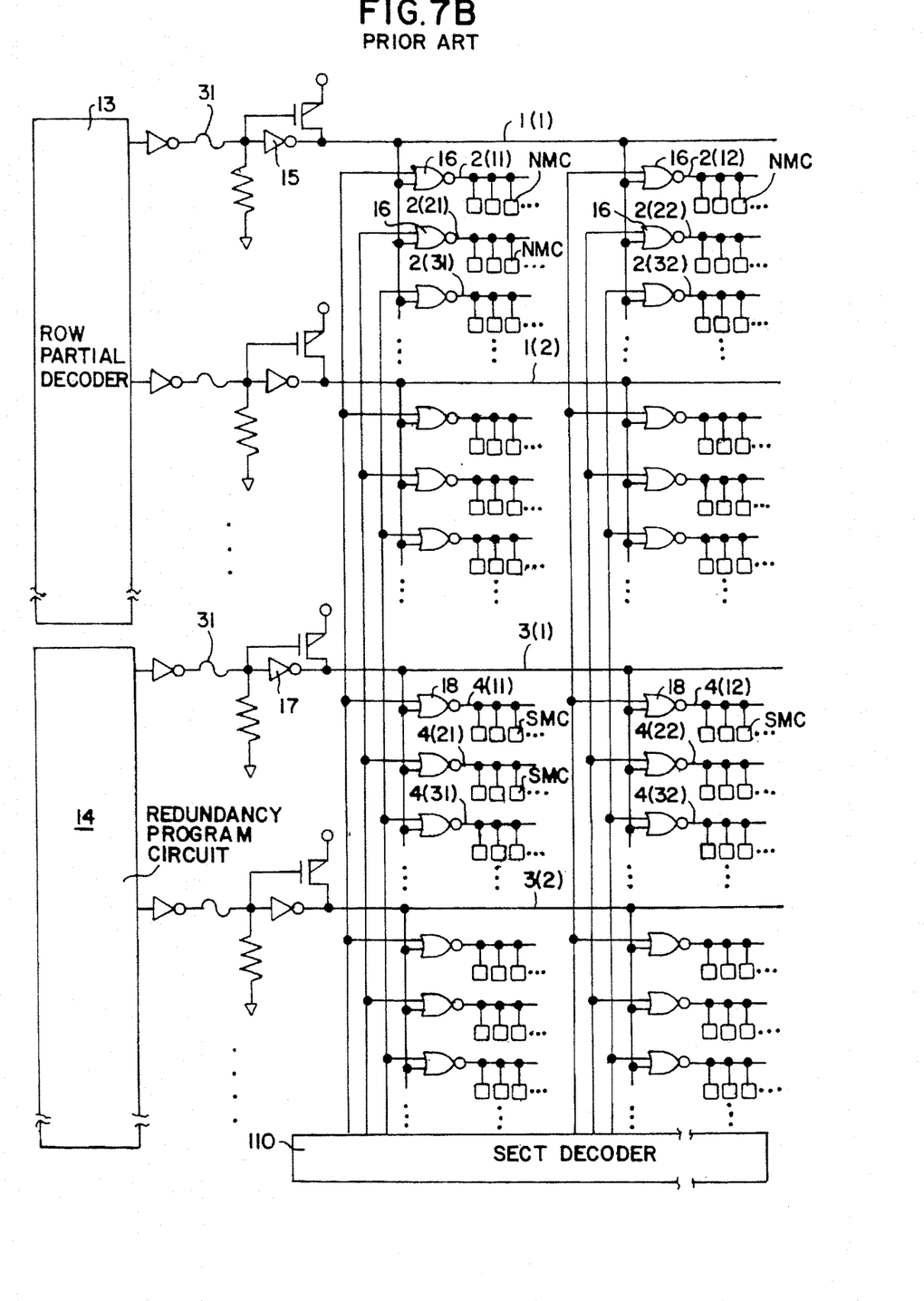

FIGS. 7(A) and 7(B) show the other example of the prior art redundancy circuit devices, which is referred to as isolation fuse system.

In FIGS. 7(A) and 7(B) the address input circuit 12 is connected to the row partial decoder 13, and the row partial decoder 13 outputs J-units of row decode addresses. Each row decode address is applied to the main word line driver 15 via a fuse 31. On the other hand, the redundancy program circuit 14 outputs K-units of spare select signals SPE1 to SPEK. Each spare select signal is applied to the spare main word line driver 17.

As a result, it is possible to select one of J-units of the main word lines 1 and the one of K-units of the spare main word lines 3. Further, in each of the main word lines 1, M-units of the subsidiary word lines 2 are arranged in correspondence to each of the sections SC1 to SCN. Further, in each of the spare main word lines 3, M-units of spare subsidiary word lines 4 are arranged in correspondence to each of the sections SC1 to SCN.

On the other hand, the address input circuit 12 is connected to the column partial decoder 19, and the column partial decoder 19 outputs the column address decode signal to the section decoder 110. The section decoder 110 outputs the section select signals SD11 to SC1M and SDN1 to SNDM to select the subsidiary word line 2 or the spare subsidiary word line 4 for each section SC1 to SCN, so that the subsidiary word line 2 or the spare subsidiary word line 4 can be selected separately for each section.

In the construction as described above, when there exists a defective address, the fuse 31 is cut off by a laser so that the defective address cannot be selected. Further, when the defective address is hit (i.e., found), one of the spare select signals SPE1 to SPEK outputted as a spare address programmed by the program section 26 is selected. In this case, although the address corresponding to the defective cell is accessed, since the fuse 31 is cut off, only the spare cells can be accessed.

In the above-mentioned isolation fuse system, since the number of the circuits controlled on the basis of the redundancy enable signal RDE is smaller as compared with the case of the inhibit system, it is regarded that the deterioration of the access time for redundancy is less.

In both the inhibit and isolation fuse systems, however, the defective cell is replaced with the spare cell for each main word line 1. In other words, in the case where the memory cells are divided into a plurality of sections as with the case of the double word line system, it is necessary to replace all of the subsidiary word lines connected to one main word line simultaneously with the spare cells.

On the other hand, in the case of the isolation fuse system as shown in FIGS. 7(A) and 7(B) since M-units of the subsidiary word lines 2 and the subsidiary word line drivers 16 are both connected to one main word line 1, when one main word line 1 and one section are selected, one of the M-units of spare main word lines 3 can be selected on the basis of the section select signals SD11 to SC1M and SDN1 to SDNM. The decode system as described above is referred to as modulation double word line system.

The modulation double word line system as described above is usually adopted when the addresses in one word line direction cannot be decided by one row decoder due to the problem related to the pattern area of the row partial decoder 13. In this redundancy system, however, when the defective cells are replaced with the spare cells for each main word line 1, it is necessary to replace M-units of the word line direction addresses at the same time.

As described above, in the prior art redundancy circuit device, when a defective cell is replaced with a spare cell in the double word line system memory cells, since the replacement is achieved for each main word line, a plurality of memory cells of the sections having no defective cell must be replaced simultaneously, so that the replacement is not effective.

On the other hand, in the case of the modulation double word line system memory cells, since a plurality of non-defective word line direction addresses are replaced simultaneously. Therefore, in the case of a 4 modulation double word line system, for instance, even if the spare cells for 4 addresses are prepared, since 4 spares must be replaced simultaneously, in practice only one address can be remedied, so the replacement efficiency is low.

Recently, with the advance of memory capacity, the replacement of defective cells with the spare cells has required more and more. In the prior art redundancy circuit device, however, in the case where a great number of spare cells cannot be prepared for reasons of chip area, there arises a problem in that the lower efficiency of the redundancy causes a reduction in the production yield of the memory chip.

SUMMARY OF THE INVENTION

With these problems in mind, therefore, it is the object of the present invention to provide a redundancy circuit device by which defective cells can be replaced with spare cells in units of each of the subsidiary word lines connected to the main word line in the double word line system memory cells, to improve the redundancy efficiency and the chip production yield markedly.

To achieve the above-mentioned object, the present invention provides a redundancy circuit device for replacing a defective normal memory cell with a spare memory cell, comprising: a plurality of sections (SC1 to SCN) each having a plurality of normal memory cells and spare memory cells, the normal memory cells being selected by activating the subsidiary word line (2) on the basis of a logic of a main word line (1) signal and a section select signal (SS) and by selecting the normal memory cells connected to the activated subsidiary word line; and a section decoder (42) for outputting a spare memory cell select signal (SPE1 to SPEK) for selecting the spare memory cells to each section, together with the section select signal (SS); said section decoder (42) outputting only the spare memory cell select signal (SPE1 to SPEK) to a defective section having a defective normal memory cell, without outputting the section select signal (SS), to replace the normal memory cells with spare memory cells in the defective section; said section decoder (42) outputting only the section select signal (SS) to a non-defective section having no defective normal memory cell, without outputting the spare memory cell select signal (SPE1 to SPEK), to select the normal memory cells in the non-defective section.

In the redundancy circuit device, there exists a plurality of the main word lines (1). Further, the redundancy circuit device comprises a row decoder (13) for selecting one of a plurality of the main word lines (1). Further, the redundancy circuit device comprises a subsidiary word line drive circuit (16) for obtaining a logic of the main word line (1) signal and the section select signal (SS), the subsidiary word line (2) being driven on the basis of an output of the subsidiary word line drive circuit (16).

Further, in the redundancy circuit device, the section decoder (42) comprises a plurality of individual section decoders (41) each corresponding to each of the sections (SC1 to SCN), each of the individual section decoders (41) having an address program circuit (14) programmed by cutting off fuses and outputting the spare memory cell select signal (SPE1 to SPEK), without outputting the section select signal (SS), when an address is hit.

Further, one input terminal of each of a plurality of the subsidiary word line drive circuits (16) of the same section (SC1 to SCN) is connected to the main word line (1) respectively, each of the individual section decoders (41) applying each section select signal (SS) to the other input terminals of a plurality of the subsidiary word line drive circuits (16) of each corresponding section.

Further, the present invention provides a redundancy circuit device for replacing a defective normal memory cell with a spare memory cell, comprising: a plurality of sections (SC1 to SCN) each having a plurality of normal memory cells and spare memory cells, the normal memory cells being selected by activating the subsidiary word line (2) on the basis of a logic of a main word line (1) signal and a section select signal (SS) and by selecting the normal memory cells connected to the activated subsidiary word line (2); a section decoder (110) for outputting a section select signal (SS) to each of the sections (SC1 to SCN); and a plurality of address program circuits (25) each corresponding to each of the sections (SC1 to SCN), each for programming a defective normal memory cell address by cutting off fuses; when an address is hit, each of the address program circuits (25) outputting a signal (RDE) for not-selecting the main word line (1) and a spare memory cell select signal (SPE1 to SPEN) for selecting the spare memory cells.

Further, the present invention provides a redundancy circuit device for replacing a defective normal memory cell with a spare memory cell, comprising: a plurality of sections (SC1 to SCN) each having a plurality of normal memory cells and spare memory cells, the normal memory cells being selected by activating the subsidiary word line (2) on the basis of a logic of a main word line (1) signal and a select signal (SD1SS, SD2SS) and by selecting the normal memory cells connected to the activated subsidiary word line (2); a section decoder (110) for outputting a select signal (SD1SS, SD2SS) to each of the sections (SC1 to SCN); a plurality of address program circuits (25) each corresponding to each of said sections (SC1 to SCN), each for programming a defective normal memory cell address by cutting off fuses; when an address is hit, each of said address program circuits (25) outputting a spare memory cell select signal (SPE11 to SPEK1) for selecting the spare memory cells; a plurality of the subsidiary word line drive circuits (16), one input terminal of each of said subsidiary word line circuits (16) of the same section being connected to the main word line (1) respectively, each section select signal (SD1SS, SD2SS) of said section decoder (SD) being applied to the other input terminal of each of said subsidiary word line circuits, each of the subsidiary word lines (2) being connected to each of output terminals of said subsidiary word line circuits (16); and a plurality of subsidiary word line drive disabling circuits (39) each provided for each group composed of a predetermined number of said subsidiary word line drive circuits (16), for disabling a plurality of said subsidiary word line drive circuits of each corresponding group from driving the subsidiary word line (2) by cutting-off fuses; when an address is hit, a plurality of said address program circuits (25) for programming a defective address by cutting fuses selecting the spare memory cells, instead of the normal memory cells connected to the subsidiary word lines (2) connected to said subsidiary word line drive circuits (16) disabled from driving by said subsidiary word line drive circuit disabling circuit (39).

Further, in the redundancy circuit device, one input terminal of each of a plurality of the subsidiary word line drive circuits (16) of the same section (SN1 to SNN) is connected to the main word line respectively, said section decoder (110) applying each select signal (SD1SS, SD2SS) to each of the other input terminals of said subsidiary word line drive circuits (16). Further, in the redundancy circuit device, the spare memory cells are selected on the basis of an output of said defective address program circuit (25) and an output of each of said subsidiary word line drive circuits (16) driven on the basis of the select signal (SD1SS, SD2SS) of said section decoder (110).

DETAILED DESCRIPTION OF THE EMBODIMENTS

The embodiments of the present invention will be described hereinbelow with reference to the attached drawings.

Figure 1A:
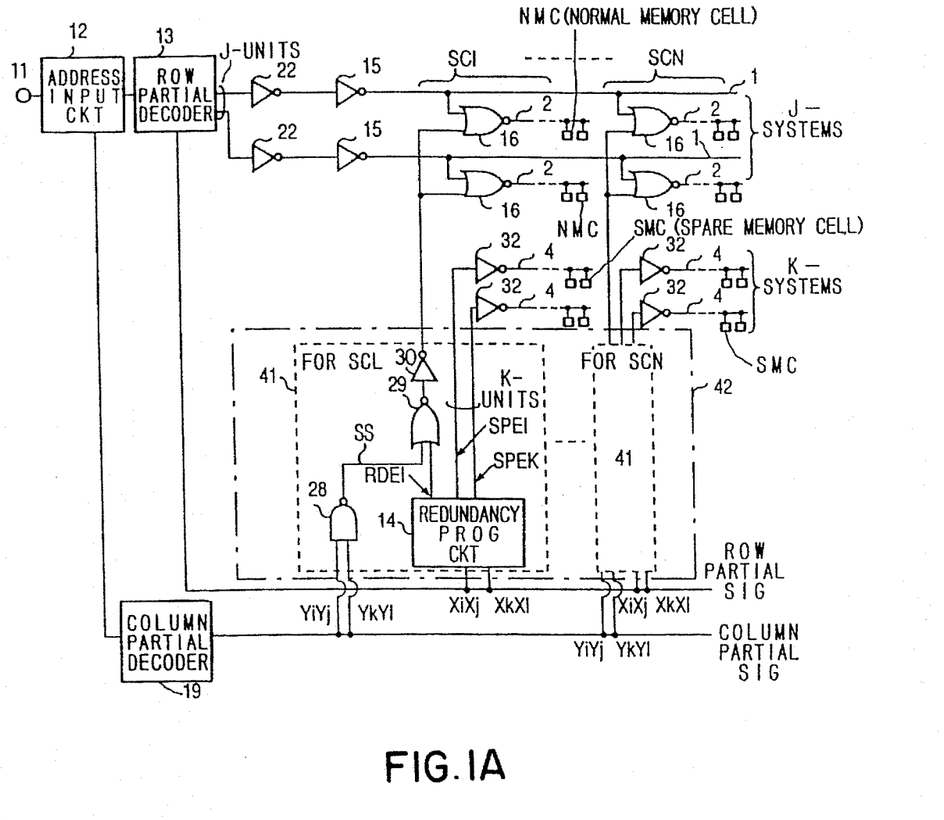
FIGS. 1(A) and 1(B) are circuit diagrams showing a first embodiment of the redundancy circuit device according to the present invention.
Figure 1B:
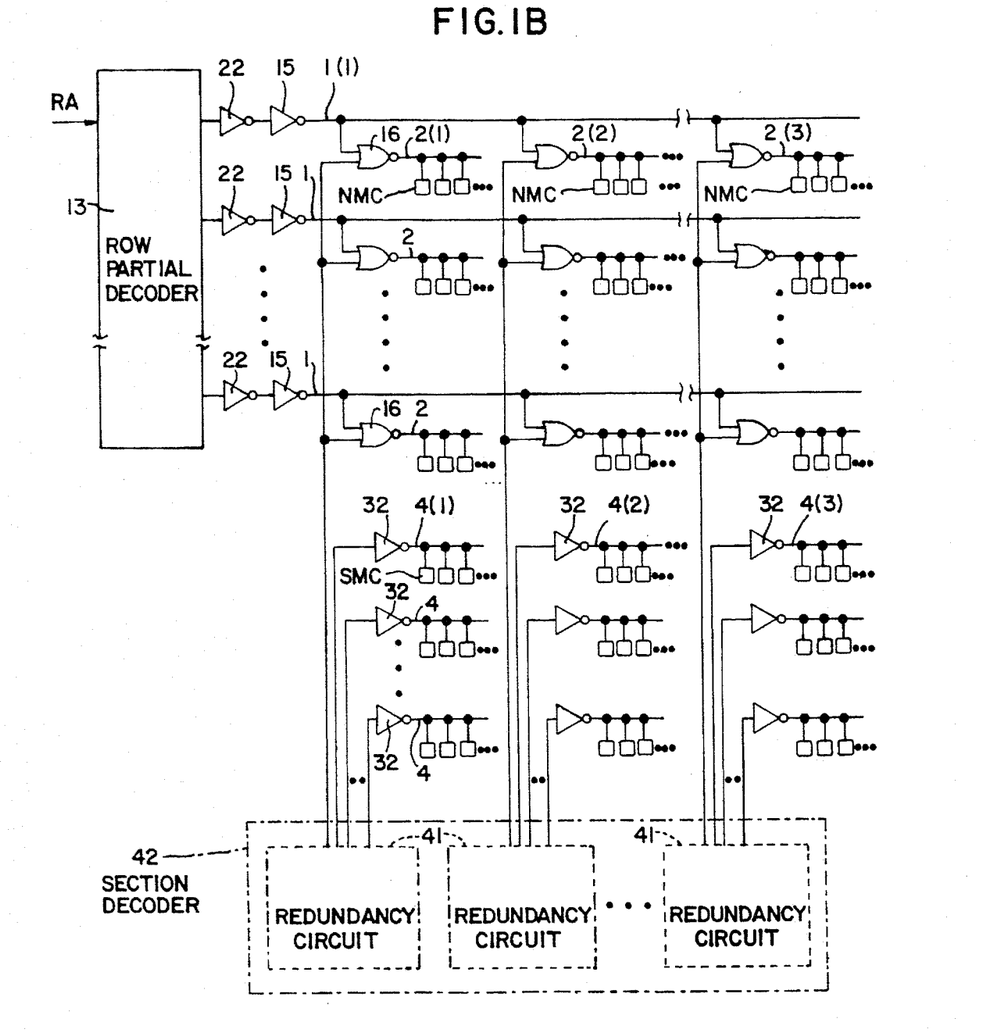

FIGS. 1(A) and 1(B) show a first embodiment of the redundancy circuit device according to the present invention. As shown in FIG. 1(A), J-units of row decoder signals are outputted by a row partial decoder 13 to drive J-systems of main word lines 1 via a NOR circuit 22 and a main word line driver 15, respectively. Further, J-systems of subsidiary word lines 2 are connected to the J-systems of the main word lines 1 via a subsidiary word line driver 16, respectively for each section SC1 to SCN. On the other hand, row partial signals XiXj and XkX1 outputted by the row partial decoder 13 and column partial signals YiYj and YkY1 outputted by a column partial decoder 19 are applied to a section decoder 42.

The section decoder 42 is provided with N-units of redundancy circuits 41 in correspondence to each of the sections SC1 to SCN. The redundancy circuit 41 is further provided with an internal redundancy program circuit 14 (as shown in FIG. 6) for outputting spare select signals SPE1 to SPEK and a redundancy enable signal RDE1 to ERDEN on the basis of the row partial signals XiXj and XkX1 outputted by the row partial decoder 13 in the case of hit to a defective cell. The internal circuit construction of the redundancy program circuit 14 is the same as that shown in FIG. 5(A).

On the other hand, the redundancy circuit 41 is provided with a NAND circuit 28 for generating a section select signal SS on the basis of the column partial signals YiYj and YkY1 outputted by the column partial decoder 19. The section signal SS is inputted to a NOR circuit 29 together with the redundancy enable signal RDE1 to RDEK, and then outputted to the outside of the section decoder 42 via a NOT circuit 30.

The spare select signals SPE1 to SPEK outputted by the section decoder 42 for each section drive the spare subsidiary word lines 4 via a spare subsidiary word line driver 32, respectively. In this case, the spare subsidiary word lines 4 are driven for each section SC1 - SCN.

On the other hand, the signal outputted by the section decoder 42 via the NOT circuit 30, that is, the logical result signal of the section select signal SS and the redundancy enable signal RDE1 to RDEK through the NOR circuit 29 is outputted to the subsidiary word line drivers 16 to restrict the driving of the subsidiary word lines 2 for each section SC1 to SCN.

The operation of the circuit construction as described above will be described hereinbelow.

First, if there exists a defective cell in the memory cells, an address in the defective cell word line direction is programmed by cutting off the fuse in the redundancy program circuit 14. In other words, since row partial signals XiXj and XkX1 are inputted from the row partial decoder 13 to the redundancy program circuit 14, the defective main word line 1 is programmed on the basis of the row partial signals.

Where a defective address is hit in the ordinary operation, on the other hand, the row decode signals outputted by the row partial decoder 13 are selected. That is, since the redundancy enable signal RDE1 to RDEK corresponding thereto is outputted by the redundancy program circuit 14 and in addition since the section select signal SS is outputted via the NAND circuit 28, a logical result of both the signals SS and RDE 1 to RDEK is obtained by the NOR circuit 29, and then outputted via the NOT circuit 30 to restrict the output of the subsidiary word line drivers 16. Therefore, all the subsidiary word lines 2 of the selected section are not selected.

On the other hand, since the spare select signal SPE1 to SPEK corresponding to the selected section is outputted by the redundancy program circuit 14 and further applied to the spare subsidiary word lines 4 via the spare subsidiary word line driver 32 respectively, the subsidiary word line 2 is replaced with the spare subsidiary word line 4. Further, in this case, the spare replacement is not achieved with respect to the main word line 1.

To allow the above-mentioned replacement with the spare to be achieved for each section SC1 to SCN, the redundancy circuit 41 is arranged for each section.

As a result, K-systems of spare subsidiary word lines 4 can be replaced for each section, so that it is possible to replace the subsidiary word lines with K×N units of spare subsidiary word lines 4 in all the sections.

As described above, in the redundancy circuit device shown in FIGS. 1(A) and 1((B), since the subsidiary word lines 2 can be replaced with the spare subsidiary word lines 4 for each section by use of the redundancy circuit 41 provided for each of a plurality of sections, it is possible to improve the redundancy efficiency markedly.

Figure 2A:
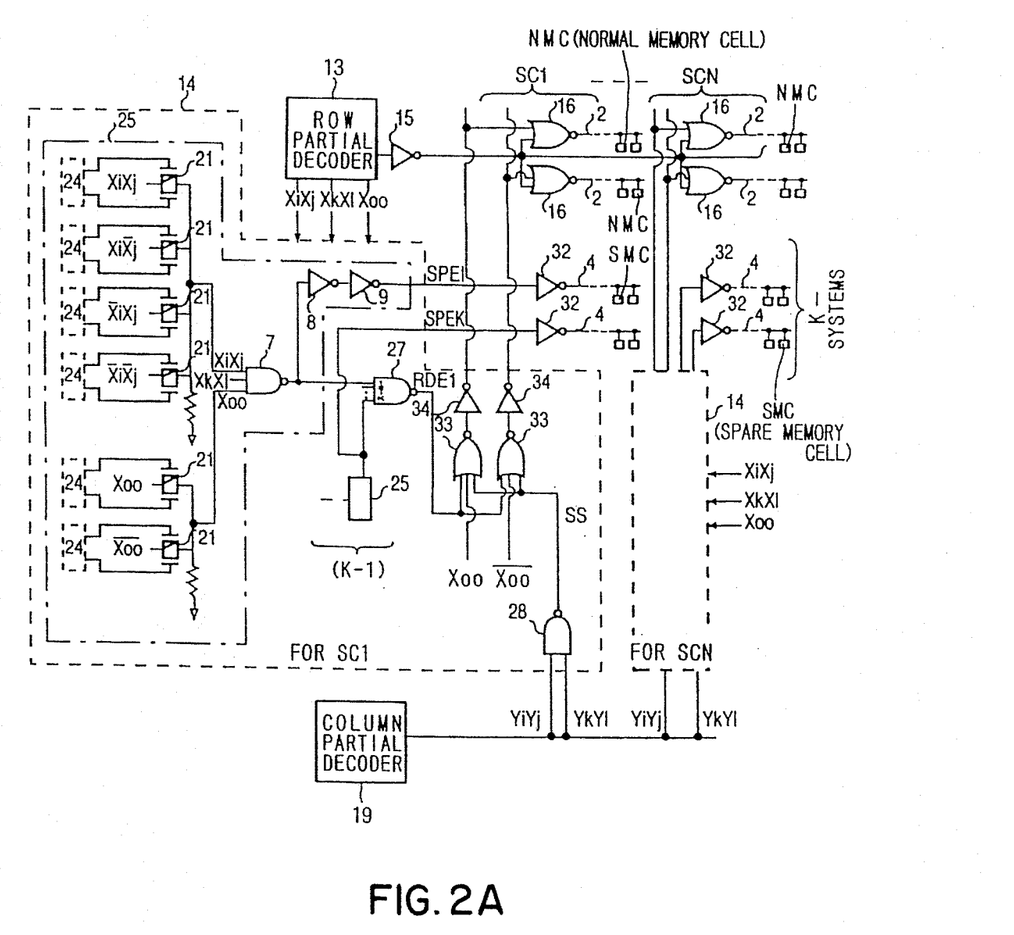
FIGS. 2(A) and 2(B) are circuit diagrams showing a second embodiment of the redundancy circuit device according to the present invention.
Figure 2B:
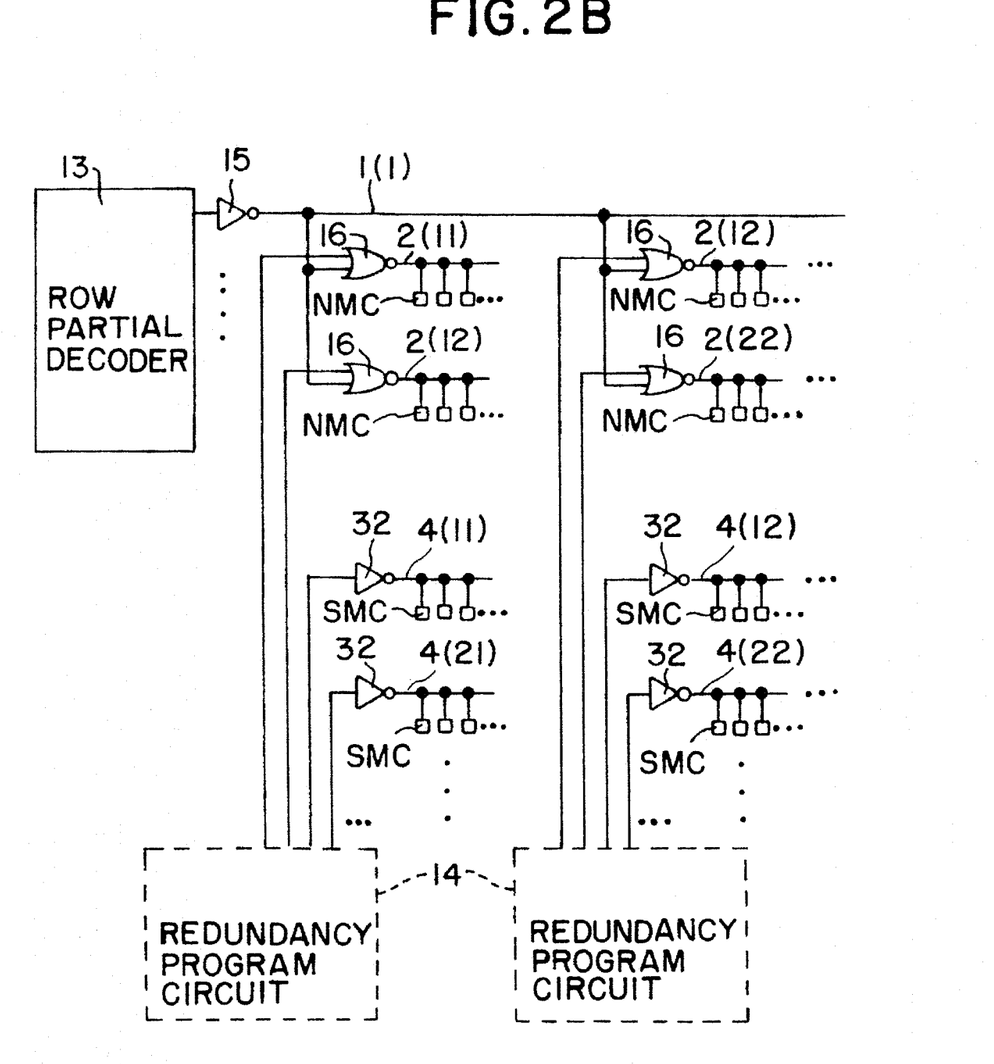

FIGS. 2(A) and 2(B) show a second embodiment of the redundancy circuit device according to the present invention, in which the modulation double word line system is shown in particular.

As shown in FIG. 2(A), the row partial decoder 13 is connected is connected to the main word line 1 via the main word line driver 15. To each main word line 1, two subsidiary word lines 2 are connected via a subsidiary word line driver 16, respectively.

On the other hand, the row partial signals XiXj, XkX1, and X00 are outputted by the row partial decoder 13. Here, the signal X00 is used to distinguish the two subsidiary word lines 2 from each other, respectively.

The row partial signals XiXj, XkX1, and X00 outputted by the row partial decoder 13 are inputted to the redundancy program circuit 14 arranged for each section SC1 to SCN.

On the other hand, the column partial signals YiYj and YkY1 are outputted by the column partial decoder 19, and then inputted to the redundancy program circuits 14, respectively.

To the redundancy program circuit 14 arranged for each section SC1 to SCN, the column partial signals YiYj and YkY1 are inputted through a NAND circuit 28. Further, the section select signal SS is outputted by the NAND circuit 28. This section select signal SS is outputted to a NOR circuit 33.

The redundancy program circuit 14 is provided with a defective address program circuit 25 therein, so that it is possible to program the turning-on and -off of the transfer gates 21 through the fuse circuit 24. For programming, the fuses of the fuse circuits 24 are cut off by a laser according to the defective cell addresses. As a result, it is possible to program the turn-on or -off of the transfer gates 21 arranged in correspondence to the respective statuses of the row partial signals XiXj and X00 outputted by the row partial decoder 13.

In the defective address program circuit 25, a NAND circuit 7 obtains the logical result of the programmed row partial signals XiXj, XkX1 and X00 to select the defective cells, and outputs the logical result as the spare select signal SPE1 to SPEK via two NOT circuits 8 and 9. That is, these spare select signals SPE1 to SPEK are outputted by the redundancy program circuits 14 for each section SC1 to SCN, and then given to the spare subsidiary word lines 4 via the spare subsidiary word line driver 32, respectively.

Further, the spare select signals SPE1 to SPEK outputted by the respective defective address program circuits 25 are applied to a NAND circuit 27 for logical processing, and generated as the redundancy enable signal RDE1 to RDEK from the redundancy program circuit 14 arranged for each section SC1 to SCN. The redundancy enable signal RDE1 to RDEK is inputted to two NOR circuits 33, respectively together with the section select signal SS and the row partial signals X00 and /X00. The logical result of each of these two NOR circuits 33 is outputted to the subsidiary word line driver 16 via a NOT circuit 34, respectively.

The operation of the circuit device constructed as described above will be described hereinbelow.

The redundancy program circuit 14 is divided for each section SC1 to SCN. Further, in the defective address program circuit 25, the redundancy program, that is, the replacement of the cell at a defective address with the spare cell has been programmed by cutting the fuse in the fuse circuit 24.

Further, when the address selected by the row partial signals XiXj, XkX1 and X00 outputted by the row partial decoder 13 hits the defective address, the NAND circuit 7 of the defective address program circuit 25 of the corresponding section outputs an original signal of the spare select signal SPE1 to SPEK. The outputted signal SPE1 to SPEK is further passed through the two NOT circuits 8 and 9 and the spare subsidiary word line driver 32, and then outputted to the spare subsidiary word line 4 as a drive signal.

On the other hand, these original signals are processed by the NAND circuit 27 and then outputted to the two NOR circuits 33 provided for each redundancy program circuit 14 as the redundancy enable signal RDE1 to RDEK. To the two NOR circuits 33, the row partial signal X00 and the inversion signal /X00 are inputted, respectively. In addition, the section select signal SS is inputted to both the NOR circuits 33.

Therefore, when the redundancy enable signals RDE1 to RDEK are not outputted, in the section selected by the section select signal SS, any one of the two subsidiary word lines 2 is selected by the row partial signals X00 and X00. However, when any one of the redundancy enable signals RDE1 to RDEK is outputted, the outputs of the two NOR circuits 33 are controlled, so that both the signals given from the subsidiary word line drivers 16 to the two subsidiary word lines 2 can be controlled.

As a result of the above-mentioned operation, when a defective address is produced and thereby the defective cell must be replaced with a spare cell, the output of one of the two subsidiary word lines 2 provided for each section is controlled in unit of section, and further only one of the K-systems of the spare subsidiary word lines 4 can be selected in unit of section. Accordingly, it is possible to improve the redundancy efficiency in the case of the modulation double word line system.

In other words, when the address selected by the row partial signals hits the programmed defective address in one section, although the main word line 1 corresponding to this address is selected, since the redundancy enable signal RED1 to REDK is outputted, all the subsidiary word lines 2 are not selected. Further, simultaneously, the spare subsidiary word line 4 can be selected through the spare subsidiary word line driver 32, so that the spare cell to be replaced can be selected by the spare select signal SPE1 to SPEK for each selected section.

In the circuit construction as described above, since there exists K-systems of spare cells for each section, it is possible to replace the cells with (K×N)-units of spare cells in all the sections.

Further, in the above-mentioned second embodiment, a two modulation system has been explained by way of example. Without being limited thereto, however, the present invention can be applied to the two or more modulation double word line system. In the case of the prior art four modulation double word line system, for instance, the defective cells must be replaced with the spare cells at four rows simultaneously. In this case, however, even if the spare cells exist at four rows, only one row can be remedied in practice. In the construction of the present invention, however, since each spare cell can be replaced with each defective cell, it is possible to increase the remedy efficiency.

Further, in the above-mentioned first and second embodiments, the redundancy circuit is provided in the section decoder for each section. Further, when the selected address hits the defective address, although the main word line is selected, the subsidiary word lines are not selected for each section on the basis of the inhibit signals. However, it is also possible to obtain the similar effect by inputting the inhibit signals to the row decoder.

Figure 3:
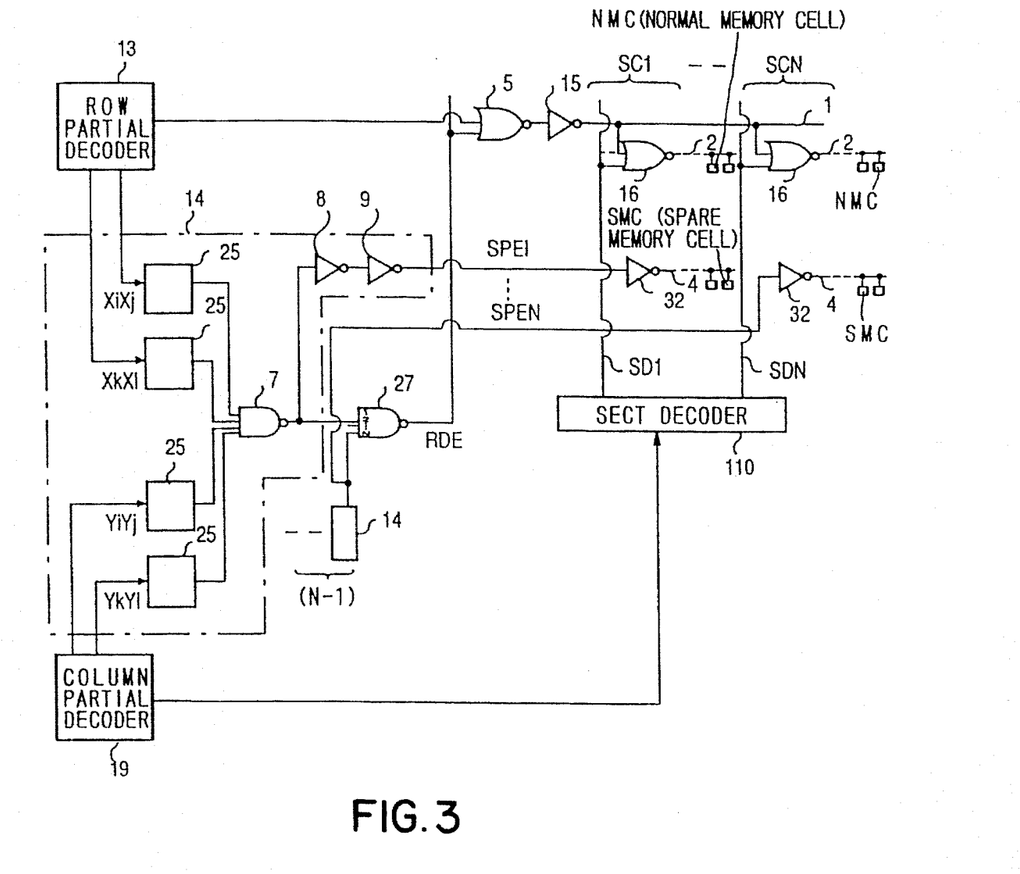
FIG. 3 is a circuit diagram showing a third embodiment of the redundancy circuit device according to the present invention.

FIG. 3 shows a third embodiment of the redundancy circuit device according to the present invention constructed on the basis of the above-mentioned point of view.

In FIG. 3, the redundancy program circuit 14 includes two defective address program circuits 25 to which the row partial signals XiXj and XkX1 are inputted by the row partial decoder 13, and two defective address program circuits 25 to which the column partial signals YiYj and YkY1 are inputted by the column partial decoder 19. The output signals of these defective address program circuits 25 are given to the NAND circuit 7.

The redundancy circuit 14 is provided for each section SC1 to SCN, the original signal of the spare select signal SPE1 to SPEN is outputted by the NAND circuit 7 of each redundancy program circuit 14. The outputted signal SPE1 to SPEK is further passed through the two NOT circuits 8 and 9 and then given as the spare select signal SPE1 SPEN to the spare subsidiary word line 4 via the spare subsidiary word line driver 32.

On the other hand, the output signals of the NAND circuits 7 of the redundancy program circuits 14 are given to the NAND circuit 27 to output the redundancy enable signal RDE. This redundancy enable signal RDE is outputted to a NOR circuit 5 and used to control the signal outputted by the row partial decoder 13 to select the main word line 1.

Further, the output of the NOR circuit 5 is given to the main word line 1 via the main word line driver 15.

Further, the output of the main word line driver 15 is connected to the subsidiary word lines 2 via the subsidiary word line driver 16, respectively. Here, the section select signals SD1 to SDN are outputted from the section decoder 110 to the subsidiary word line drivers 16 to select the section of the corresponding subsidiary word line 2.

In the construction as described above, the redundancy program circuit 14 has a function of replacing the defective cells with the spare cells in unit of two subsidiary word lines 2 for each section. Therefore, the row partial signals XiXj and XkX1 of the row partial decoder 13 and the column partial signals YiYj and YkY1 of the column partial decoder 19 are detected. To program the defective address, the fuse of the defective address program circuit 25 is cut off to program both the row address and the section address.

Further, when the selected address hits both the row address and the section address set in the redundancy program circuit 14, the redundancy enable signal RDE is outputted by the NAND circuit 27, and all the word lines other than the spare, that is, the main word line 1 and the subsidiary word lines 2 are set to the non-selected status.

On the other hand, in the memory cells, at least one spare cell is set for each section, and can be selected on the basis of the spare select signals SPE1 to SPEN. In other words, one of the spare cell of these spare cells is selected in the corresponding section, instead of the main word line 1 and the subsidiary word lines 2.

Further, in the above-mentioned first, second and third embodiments, the inhibit system has been explained. Without being limited only thereto, however, the present invention can be applied to the isolation fuse system, as shown in FIG. 7(A) and 7(B), in which the fuse provided for each address is cut off for redundancy.

Figure 4:
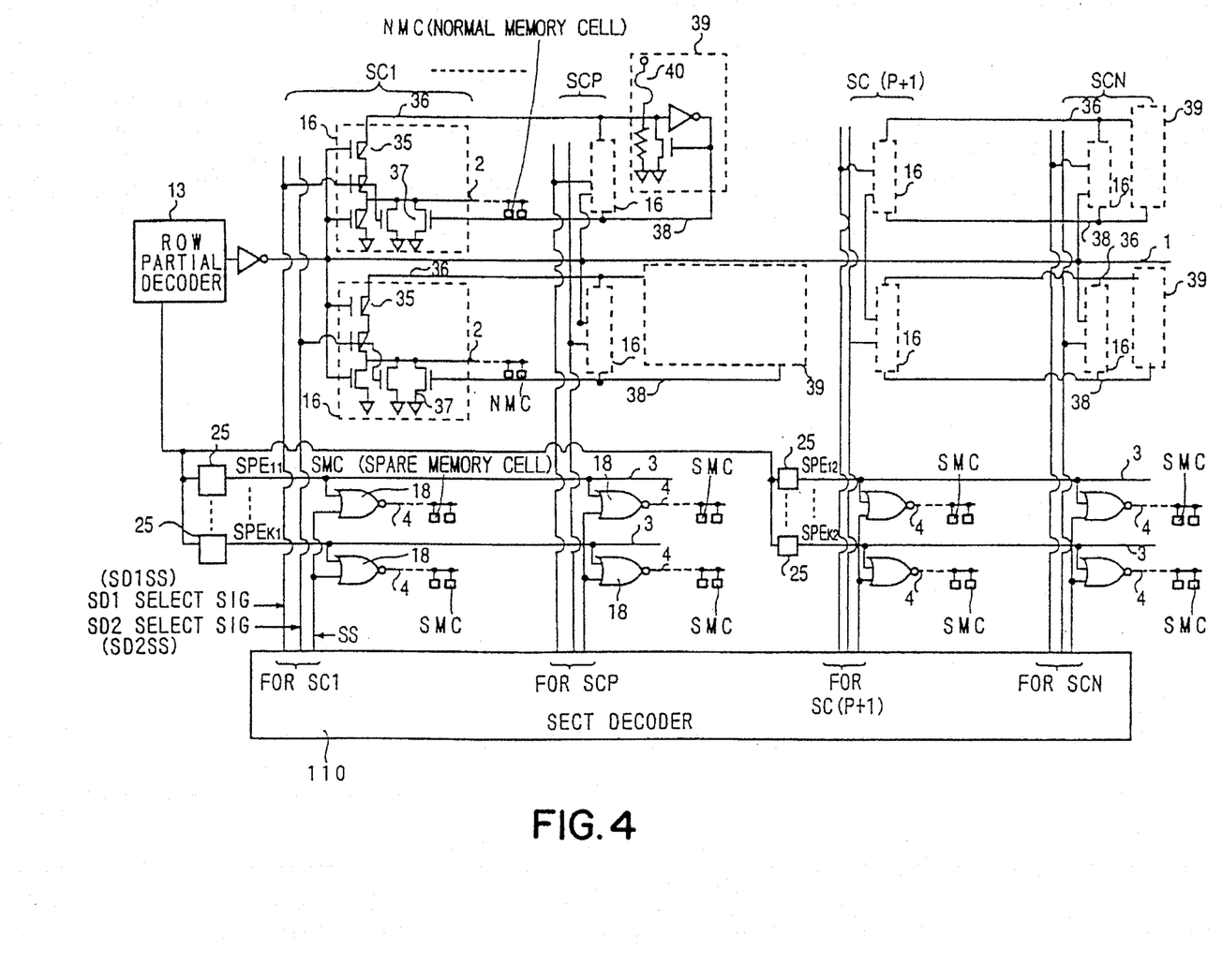
FIG. 4 is a circuit diagram showing a fourth embodiment of the redundancy circuit device according to the present invention.

FIG. 4 shows a fourth embodiment of the redundancy circuit device according to the present invention, in which the present invention is applied to the redundancy circuit device of isolation fuse system.

In FIG. 4, the sections SC1 to SCP are considered as one block and the sections SC(P+1) to SCN are considered as the other block, and the defective cells are replaced with the spare cells in units of block.

Now, in the subsidiary word line driver 16, the source of each of PMOS transistors 35 is connected to a voltage supply line 36, and the gate of each of NMOS transistors 37 is connected to a signal line 38, respectively. Here, the voltage supply line 36 and the signal line 38 are both used in common for the PMOS transistors 35 and the NMOS transistors 37 of the respective subsidiary word line drivers 16 of the section SC1 to SCP. In the same way, the voltage supply line 36 and the signal line 38 are both used in common for the PMOS transistors 35 and the NMOS transistors 37 of the respective subsidiary word line drivers 16 of the section SC(P+i) to SCN.

A pull-up circuit 39 fixes the voltage supply line 36 at a high potential supply voltage Vcc and the signal line 38 at the ground potential Vss. This pull-up circuit 39 is arranged for each group of the subsidiary word lines 2 of the sections SC1 to SCP and for each group of the subsidiary word lines 2 of the sections SC(P+1) to SCN.

Further, a fuse 40 arranged for each pull-up circuit 39 is provided with such a function as to connect the supply voltage line 36 to the high potential supply voltage Vcc. Therefore, when the fuse 40 is cut off, the voltage supply line 36 is grounded to the ground voltage Vcc and the signal line 38 is set to a high level.

Further, the defective address decoder circuits 25 are connected to the row partial decoder 13 to drive the spare subsidiary word lines 4 via a spare subsidiary word line driver 18, respectively on the basis of the spare select signals SPE11 to SPEK1 and SPE12 to SPEK2, separately.

Further, a section decoder 110 outputs a SD1 select signal, a SD2 select signal and a section select signal SS for each section to control the operation of the subsidiary word line driver 16.

In the circuit construction as described above, when a part of the addresses in a word line direction is required to be replaced with the spare cells, the fuses 40 of the corresponding pull-up circuits 40 are cut off to fix the voltage supply line 36 to the high potential supply voltage Vcc and the signal line 38 to the ground potential Vss. Then, since all the subsidiary word lines 2 of the corresponding block are fixed to the ground potential Vss, the main word line 1 is selected and the corresponding subsidiary word lines 2 are not selected, even if the section decoder 110 outputs the SD1 select signal and the SD2 select signal to designate the block.

On the other hand, when the address hits the defective address programmed in the defective address program circuit 25, since the spare main word line 3 is driven by the spare select signals SPE11 to SPE2K via the spare subsidiary word line 4, the spare cell can be accessed.

As described above, in the isolation fuse redundancy system, since the signals for inhibiting the defective cells are unnecessary, it is possible to increase the access time.

Further, in the two modulation double word line system as described above, since the subsidiary word lines 2 of two systems are connected to the one main word line 1, it is possible to replace the spare cells of the subsidiary word line 2 system by system, without replacing the spare cells for two systems simultaneously as with the case of the prior art circuit device.

As described above, in the redundancy circuit device according to the present invention, defective cells can be replaced with spare cells for each subsidiary word line in the double word line system memory (in which the word line direction is selected by the main word line and the subsidiary word lines divided into a plurality of sections in the word line direction) and the modulation double word line system (in which a plurality of subsidiary word line drivers are connected to one main word line for each section), it is possible to improve the redundancy efficiency and the remedy rate of the memory chip markedly, so that economical memory chips can be realized.

What is claimed is:

1. A redundancy circuit device for replacing a defective normal memory cell with a spare memory cell, comprising:

a plurality of sections each having a plurality of normal memory cells and spare memory cells, the normal memory cells being selected by activating a subsidiary word line based on a main word line signal and a section select signal and by selecting the normal memory cells connected to the activated subsidiary word line; and a section decoder for outputting a spare memory cell select signal for selecting the spare memory cells in each of the sections, and outputting the section select signal, said section decoder outputting only the spare memory cell select signal to a defective section having a defective normal memory cell, without outputting the section select signal, to replace the normal memory cells with spare memory cells in the defective section, said section decoder outputting only the section select signal to a non-defective section not having a defective normal memory cell, without outputting the spare memory cell select signal, to select the normal memory cells in the non-defective section.

2. The redundancy circuit device of claim 1, further comprising a plurality of the main word lines.

3. The redundancy circuit device of claim 2, which further comprises a row decoder for selecting one of the plurality of the main word lines.

4. The redundancy circuit device of claim 1, which further comprises a subsidiary word line drive circuit for performing a logic function with the main word line signal and the section select signal, the subsidiary word line being driven on the basis of an output of said subsidiary word line drive circuit.

5. The redundancy circuit device of claim 2, which further comprises a subsidiary word line drive circuit for performing a logic function with the main word line signal and the section select signal, the subsidiary word line being driven on the basis of an output of said subsidiary word line drive circuit.

6. The redundancy circuit device of claim 3, which further comprises a subsidiary word line drive circuit for performing a logic function with the main word line signal and the section select signal, the subsidiary word line being driven on the basis of an output of said subsidiary word line drive circuit.

7. The redundancy circuit device of claim 1, wherein said section decoder comprises a plurality of individual section decoders corresponding to each of said sections, each of the individual section decoders having an address program circuit programmed by cutting off fuses and outputting the spare memory cell select signal, without outputting the section select signal, when an address is found.

8. The redundancy circuit device of claim 4, wherein said section decoder comprises a plurality of individual section decoders corresponding to each of said sections, each of the individual section decoders having an address program circuit programmed by cutting off fuses and outputting the spare memory cell select signal, without outputting the section select signal, when an address is found.

9. The redundancy circuit device of claim 6, wherein said section decoder comprises a plurality of individual section decoders corresponding to each of said sections, each of the individual section decoders having an address program circuit programmed by cutting off fuses and outputting the spare memory cell select signal, without outputting the section select signal, when an address is found.

10. The redundancy circuit device of claim 7, wherein one input terminal of each of a plurality of the subsidiary word line drive circuits of same section are connected to the main word line respectively, each of said individual section decoders applying each section select signal to other input terminals of a plurality of the subsidiary word line drive circuits of each corresponding section.

11. The redundancy circuit device of claim 8, wherein one input terminal of each of a plurality of subsidiary word line drive circuits of same section are connected to a main word line respectively, each of said individual section decoders applying each section select signal to other input terminals of a plurality of the subsidiary word line drive circuits of each corresponding section.

12. The redundancy circuit device of claim 9, wherein one input terminal of each of a plurality of the subsidiary word line drive circuits of same section are connected to the main word line respectively, each of said individual section decoders applying each section select signal to other input terminals of a plurality of the subsidiary word line drive circuits of each corresponding section.

13. A redundancy circuit device for replacing a defective normal memory cell with a spare memory cell, comprising:

a plurality of sections each having a plurality of normal memory cells and spare memory cells, the normal memory cells being selected by activating a subsidiary word line on the basis of a main word line signal and a section select signal and by selecting the normal memory cells connected to the activated subsidiary word line;

a section decoder for outputting the section select signal to each of said sections; and a plurality of address program circuits each corresponding to each of said sections, each for programming a defective normal memory cell address by cutting off fuses, when an address is found, each of said address program circuits outputting a signal for not-selecting the main word line and a spare memory cell select signal for selecting the spare memory cells.

14. A redundancy circuit device for replacing a defective normal memory cell with a spare memory cell, comprising:

a plurality of sections each having a plurality of normal memory cells and spare memory cells, the normal memory cells being selected by activating a subsidiary word line based on a main word line signal and a select signal and by selecting the normal memory cells connected to the activated subsidiary word line;

a section decoder for outputting the select signal to each of said sections;

a plurality of address program circuit groups each having a plurality of defective address program circuits, and each corresponding to a predetermined number of said sections, each of said address program circuit groups programming a defective normal memory cell address by cutting off fuses, when an address is found, each of said address program circuit groups outputting a spare memory cell select signal for selecting the spare memory cells;

a plurality of subsidiary word line drive circuits, one input terminal of each of said subsidiary word line circuits being connected to the main word line respectively, each section select signal of said section decoder being applied to the other input terminal of each of said subsidiary word line circuits, subsidiary word lines being connected to an output terminal of each of said subsidiary word line circuits; and a plurality of subsidiary word line drive disabling circuits provided for each group composed of a predetermined number of said subsidiary word line drive circuits, for disabling a plurality of said subsidiary word line drive circuits of each corresponding group from driving the subsidiary word line by cutting-off fuses, when an address is found, a plurality of said defective address program circuits for programming a defective address by cutting fuses selecting the spare memory cells, instead of the normal memory cells connected to the subsidiary word lines connected to said subsidiary word line drive circuits disabled from driving by said subsidiary word line drive circuit disabling circuit.

15. The redundancy circuit device of claim 14, wherein one input terminal of each of a plurality of the subsidiary word line drive circuits of the same section is connected to the main word line respectively, said section decoder applying each select signal to each of the other input terminals of said subsidiary word line drive circuits of the same section.

16. The redundancy circuit device of claim 14, wherein the spare memory cells are selected on the basis of an output of spare subsidiary word line drive circuits, each said circuit being driven by an output of said defective address program circuit and a section select signal from said section decoder.

17. The redundancy circuit device of claim 15, wherein the spare memory cells are selected on the basis of an output of spare subsidiary word line drive circuits, each said circuit being driven by an output of said defective address program circuit and a section select signal from said section decoder.

* * * * *